US010630291B1

(12) United States Patent
Zhang

(10) Patent No.: US 10,630,291 B1
(45) Date of Patent: Apr. 21, 2020

(54) INTEGRATED CIRCUIT DELAY CELL

(71) Applicant: NXP B.V., Eindhoven (NL)

(72) Inventor: Xu Zhang, Chandler, AZ (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/183,724

(22) Filed: Nov. 7, 2018

(51) Int. Cl.
*H03K 19/003* (2006.01)
*H03K 17/284* (2006.01)
*H03K 5/00* (2006.01)

(52) U.S. Cl.
CPC ..... *H03K 19/00323* (2013.01); *H03K 17/284* (2013.01); *H03K 19/00315* (2013.01); *H03K 2005/00045* (2013.01)

(58) Field of Classification Search
CPC .......... H03K 19/003; H03K 19/00315; H03K 19/00323; H03K 2005/00013; H03K 2005/00019; H03K 2005/00026; H03K 2005/00045; H03K 17/28; H03K 17/284
See application file for complete search history.

(56) References Cited

U.S. PATENT DOCUMENTS 5,081,380 A * 1/1992 Chen ............... H03K 5/133
323/312
7,619,457 B1 * 11/2009 Mai ............... H03H 11/265
327/264

OTHER PUBLICATIONS

C. Carvalho, et al., "Start-up Circuit for Low-power Indoor Light Energy Harvesting Applications," Electronics Letters, vol. 49, No. 10, pp. 669-671. (2013).
H.-B. Le, et al., "A Long Reset-Time Power-On Reset Circuit with Brown-Out Detection Capability," IEEE Transactions on Circuits and Systems—II: Express Briefs, vol. 58, No. 11, pp. 778-782. (2011).

* cited by examiner

*Primary Examiner* — Lincoln D Donovan
*Assistant Examiner* — Diana J. Cheng

(57) ABSTRACT

An integrated circuit delay cell includes an input circuit to establish a current level in the circuit, a switch configured to control an on/off time of a delay circuit, a delay circuit including at least one current starved stage configured to mirror the current level, the delay circuit configured to control a speed of a rise and/or fall time of an output signal, and a glitch discharging circuit connected to the delay circuit configured to tolerate and discharge unwanted charge of the delay circuit.

17 Claims, 3 Drawing Sheets

INTEGRATED CIRCUIT DELAY CELL

TECHNICAL FIELD

Various example embodiments disclosed herein relate to integrated circuit delay cells, and more particularly to a glitch free delay cell that may have a transition current optimized for a low voltage power supply.

SUMMARY

A brief summary of various example embodiments is presented below. Some simplifications and omissions may be made in the following summary, which is intended to highlight and introduce some aspects of the various example embodiments, but not to limit the scope of the invention. Detailed descriptions of example embodiments adequate to allow those of ordinary skill in the art to make and use the inventive concepts will follow in later sections.

Example embodiments include an integrated circuit delay cell having an input circuit to establish a current level in the circuit, a switch configured to control an on/off time of a delay circuit, a delay circuit including at least one current starved stage configured to mirror the current level, the delay circuit configured to control a speed of a rise/fall time of an output signal, and a glitch discharging circuit connected to the delay circuit configured to tolerate and discharge unwanted charge of the delay circuit.

The delay circuit may include a plurality of current starved stages. Each stage may include a current limiting transistor and an inverter.

The delay circuit may include a plurality of nodes to be discharged by the glitch discharging circuit. Each of the plurality of nodes may be connected to a decoupling capacitor.

At least one of the decoupling capacitors may be connected in parallel with a pull-down transistor. The pull-down transistor may be an NMOS transistor. The pull-up transistor may be a PMOS transistor.

At least one of the decoupling capacitors is connected in parallel with a clamping transistor.

At least one of the decoupling capacitors is connected in parallel with a pull-up transistor.

Example embodiments also include a method of operating a circuit, including establishing a circuit current using a first transistor of a first conductivity type, establishing a mirrored current of the circuit current using at least one second transistor of the first conductivity type, wherein the plurality of second transistors are part of a delay circuit having at least one current stage, switching on/off time periods of the delay circuit, tolerating and discharging unwanted charge from the delay circuit, and toggling an output logic device based on a rise and/or fall time of the delay circuit.

A speed of the rise and/or fall time may be determined by a number of current stages of the delay circuit.

The method may include discharging unwanted charge from nodes of the delay circuit using decoupling capacitors.

The method may include pulling down at least one decoupling capacitor to ground using a pull-down transistor.

The method may include pulling up at least one decoupling capacitor to a voltage source using a pull-up transistor.

The method may include clamping a voltage level of the at least one decoupling capacitor using a clamping transistor.

The method may include using at least one inverter in series with at least one second transistor to limit an amount of current in the delay circuit.

BRIEF DESCRIPTION OF THE DRAWINGS

Additional objects and features of the invention will be more readily apparent from the following detailed description and appended claims when taken in conjunction with the drawings. Although several example embodiments are illustrated and described, like reference numerals identify like parts in each of the figures, in which:

DETAILED DESCRIPTION

Figure 1A:
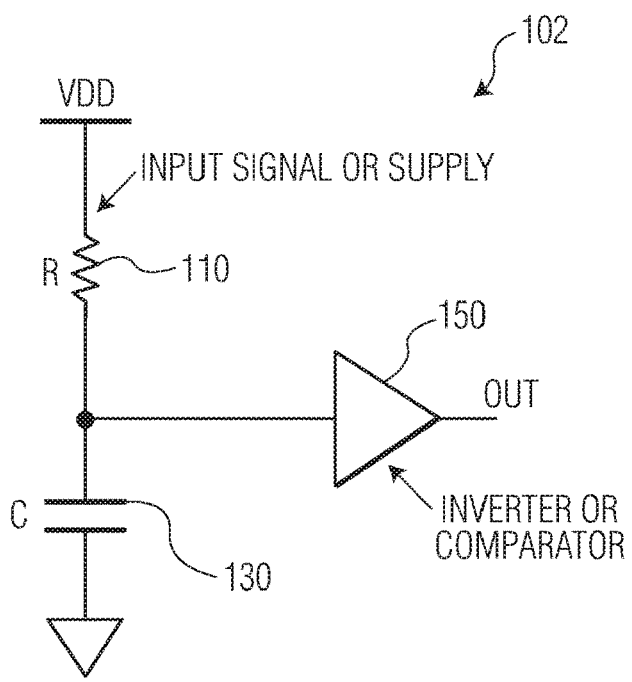
FIGS. 1A and 1B illustrate an example of a delay cell circuit implemented by current over capacitor circuit or RC filtering circuit in accordance with example embodiments described herein.

It should be understood that the figures are merely schematic and are not drawn to scale. It should also be understood that the same reference numerals are used throughout the figures to indicate the same or similar parts.

The descriptions and drawings illustrate the principles of various example embodiments. It will thus be appreciated that those skilled in the art will be able to devise various arrangements that, although not explicitly described or illustrated herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various example embodiments described herein are not necessarily mutually exclusive, as some example embodiments can be combined with one or more other example embodiments to form new example embodiments. Descriptors such as "first," "second," "third," etc., are not meant to limit the order of elements discussed, are used to distinguish one element from the next, and are generally interchangeable. Values such as maximum or minimum may be predetermined and set to different values based on the application.

Semiconductor delay cells may be widely applied to adjust a phase or timing of control signals, to control a sequence of circuit behavior, to form clock signals, etc. During a signal transition, the semiconductor delay cell may consume more power than in a steady working mode due to togglings of signals and charging of internal capacitors. This power consumption could be detrimental for a power supply with a limited transient loading capability. Excessive transition current could collapse an entire chip or cause malfunctions therein. Delay cell circuit short-through current is one of the reasons for the excessive transition current. Also, control sequences may have problems with glitches due to noises coupled to high impedance nodes within the delay cell. Through use of a properly configured delay cell circuit, transition current may be minimized.

Example embodiments described herein include a glitch-free delay cell circuit having a minimized transition current that may be used for a low power supply. The delay from supply ramp-up or a transition of a control signal may be generated through a current over capacitor approach.

Example embodiments may be configured to avoid a short-through current caused by a slow transition or slow powering up ramp of a circuit. Signal nodes may be gated by a Power-on-Reset (POR) signal to allow the signal nodes to correctly initialize and permit the delay cell circuit to have a glitch free operation. Example embodiments described herein may apply to internet of things (IoT), energy harvesting, and any other applications featuring low power requirements.

Selected nodes in a signal path may be initialized to avoid glitches. Short-through current of a delay cell circuit, which flows from the supply to ground via all the transistors in the path when the input is at around half of the supply voltage, may be optimized using current starved stages to gradually increase a speed of a rise/fall time of a power signal. Selected signal nodes may be reset by the POR signal to avoid a transient high impedance node when a power supply ramps up.

Figure 1B:
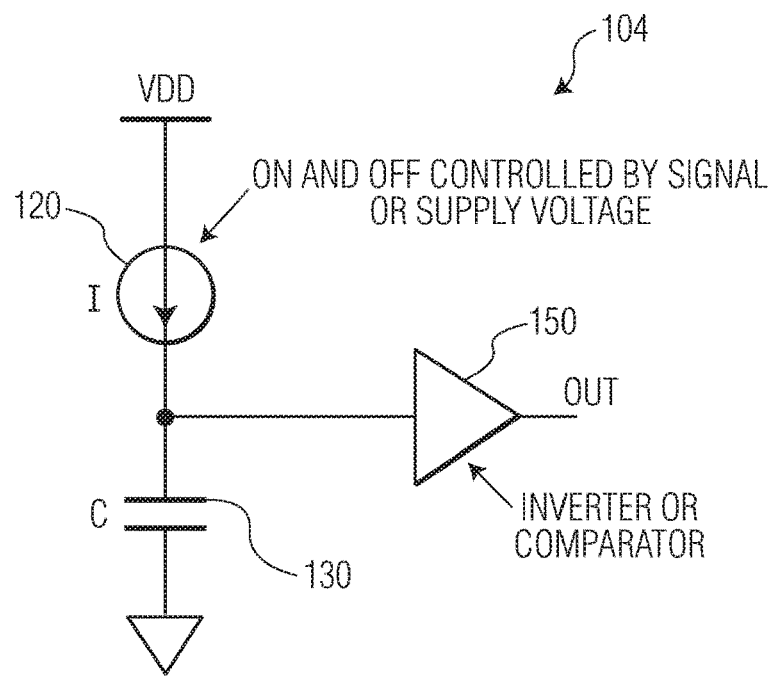

FIGS. 1A and 1B illustrate delay cell circuits 102 and 104 implemented by a current over capacitor configuration 102 or RC filtering circuit 104 in accordance with example embodiments described herein. For an RC filtering circuit 104, delay from a supply VDD ramp-up could be generated when a resistor 110 is connected to the supply VDD. If a control input signal is used, delay from the control input signal could be generated when the resistor 110 is connected to the control input signal. For a current over capacitor circuit illustrated in FIG. 1B, delay from a supply VDD ramp-up could be generated when an availability of a current source 120 is controlled by the supply. Delay from a control signal could be generated, when the current source 120 is switched on and off by a control signal. The current source 120 and the capacitor element 130 of FIG. 1B and the resistor network 110 of FIG. 1A may respectively connect to a node 140 that connects to a logic circuit 150. The logic circuit 150 may be an inverter circuit or a comparator circuit. As illustrated in FIG. 3D, the delay cell circuits 102 and 104 of FIGS. 1A and 1B may have slow rise or fall transitions at the input of the logic circuit 150. The logic circuit 150 following the delay elements 110, 120 and 130 may cause considerable short-through current if input transitions capacitor element 130 are too slow.

Figure 2:
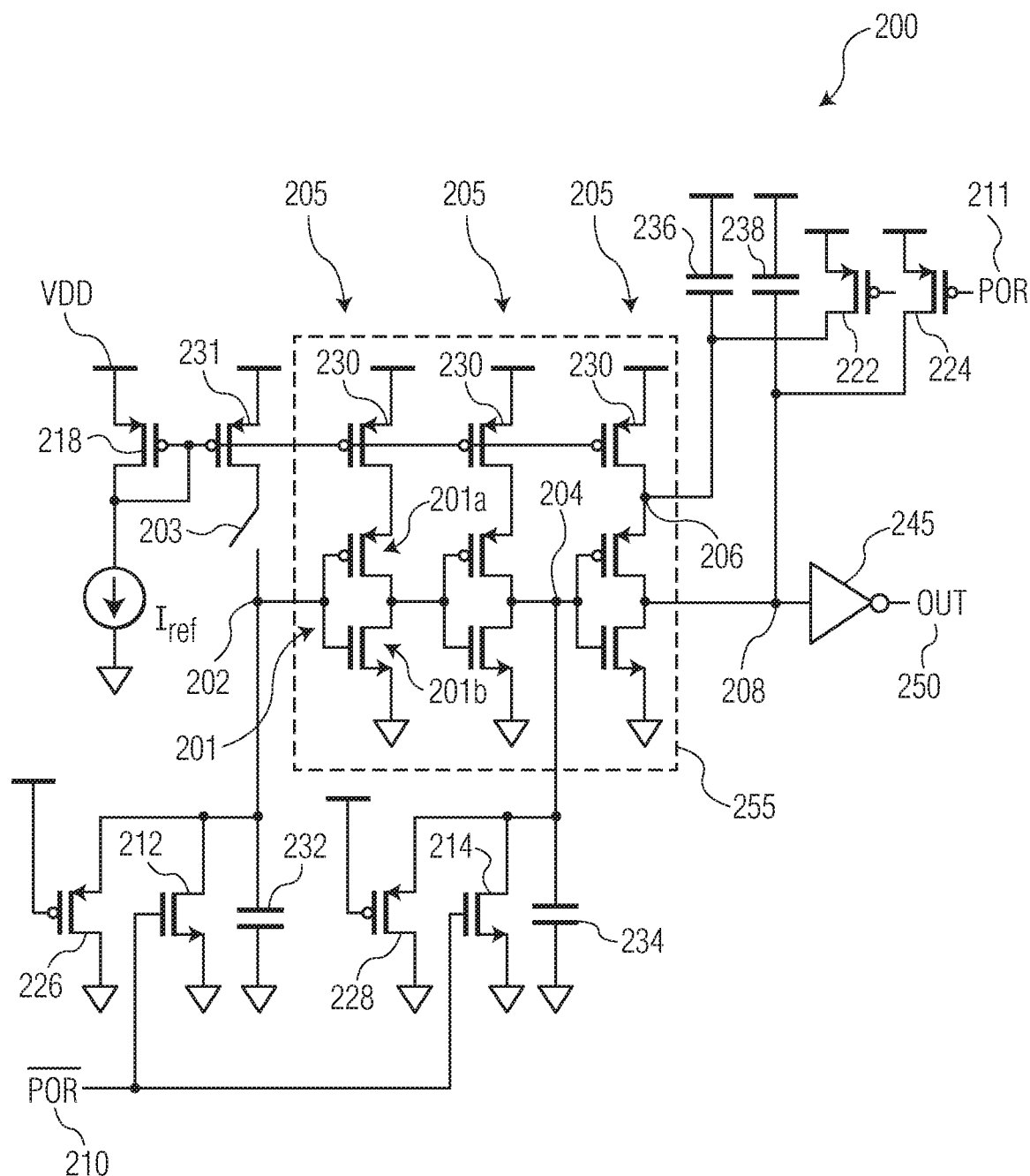
FIG. 2 illustrates a current starved delay cell circuit with a state reset in accordance with example embodiments described herein.

FIG. 2 illustrates a current starved delay cell circuit 200 with a state reset in accordance with example embodiments described herein. To avoid short-through current in the delay cell circuit 200, a time delay circuit 255 may include a plurality of current starved stages 205. A stage may have the current "starved" by using the current mirror configuration to limit an amount of current in one stage. Multiple stages may be used to increase an amount of current and a speed of the rise/fall time. Thus the current starved stages 205 may gradually increase the speed of the rise/fall time of power applied at an output node 250. A greater number of stages may increase a delay caused by the time delay circuit 255. Three stages 205 are illustrated, but example embodiments are not limited thereto. A larger or smaller number of stages may be used to vary the speed of the rise/fall time to be respectively slower or faster. Each stage has its own short-through current. Switch 203 is on when the circuit intends to generate a delayed signal from the supply ramp-up. Switch 203 is gated by a control signal when the circuit intends to delay the control signal.

The current starved stages 205 may increase a speed of the rise/fall time of the input signal at node 202 to an optimized value in terms of power consumption. According to example embodiments, there may be an optimized transition time (rise/fall time) for power consumption. The transition time may not be too slow because the transition time may cause the short-through current. The transition time may not be too fast because the use of more current that may charge or discharge explicit or intrinsic capacitors in the signal paths.

A current starved stage 205 may include a PMOS transistor 230 in series with a CMOS inverter 201. The CMOS inverter 201 may include a PMOS transistor 201a in series with an NMOS transistor 201b. A gate of the PMOS transistor 201a is connected to a gate of the NMOS transistor 201b at a node 202. The PMOS transistors 230 may be used to lower, or starve, current entering the inverters 201. Each inverter 201 in the inverter stage 205 inverts its input and increases the rise and fall times of the signal at its output with PMOS transistors 230. Input current to the delay cell circuit 200 may be generated through the PMOS transistor 218. By connecting to the PMOS 218 gate, PMOS transistor 231 and PMOS transistors 230 may act as current mirrors to channel a scaled current level therethrough as passes through PMOS transistor 218.

The current starving approach may generate transient high impedance nodes in the signal paths when generating a delayed signal from supply ramp-up. For example, nodes 202, 206 and 208 may have high impedance when the power supply VDD is low or a reference current $I_{REF}$ is not available during the supply ramp-up. Current through PMOS transistor 231 and through PMOS transistors 230 may mirror $I_{REF}$. VDD powers all of the transistor and capacitor nodes at the top of FIG. 2. A state of the nodes 202, 206, and 208 may be unknown for a long time during the supply ramp-up and be a root cause of glitches at the output 250 of a logic circuit 245. If node 208 is at a middle-rail voltage, the node 208 may cause significant short-through current at the logic circuit 245 directly. A time delay circuit 255 described herein may delay a ramp-up time of VDD such that any glitches present during the supply ramp-up will expire before a circuit is ready to turn on.

To expire any glitches due to unwanted charge or coupling at nodes 202, 204, 206, or 208, decoupling capacitors 232, 234, 236, and 238 may be used to absorb the noise charge at the nodes. To discharge the charged decoupling capacitors before power is applied to a circuit, the delay cell circuit 200 may include pull-down NMOS transistors 212 and 214 and pull-up PMOS transistors 222 and 224. To avoid transient high impedance behavior at input node 202, an inverted POR (Power-on-Reset) signal 210 may be used to pull-down the NMOS transistors 212 and 214 to ground and discharge capacitors 232 and 234. The NMOS transistors 212 and 214 may be arranged in parallel with the clamping capacitors 232 and 234. Similarly, a POR signal 211 may be used to pull-up PMOS transistors 222 and 224 to VDD to discharge decoupling capacitors 236 and 238. The PMOS transistors 222 and 224 may be arranged in parallel with the decoupling capacitors 236 and 238. The inverted POR signal 210 may indicate that a power supply (not illustrated) is ready. Depending on whether an accurate delay is needed, POR signal 210 may or may not provide an indication of the availability of reference current $I_{REF}$. The POR signal 210 may indicate to circuits within a chip that power is available.

The delay cell circuit 200 may include clamping capacitors 232 and 234. PMOS transistors 226 and 228 may be applied to clamp the voltage on clamping capacitors 232 and 234 to a low value, which may be configured to improve noise tolerance of the delay cell circuit 200 when the power supply VDD is very close to ground potential. As noted, capacitors 234 and 238 may set and hold the initial states of nodes 204 and 208 in a glitch free operation. Capacitor 234 may also offer a degree of freedom to tune the delay.

Capacitor 234 may not be too large such as to compromise a purpose of speeding up the signal. Capacitor 236 may provide extra pull-up capability because the PMOS transistor 230 is current limited. Capacitor 232 may be in the range of a few pF. Capacitors 222, 224, and 234 may be in the hundreds of nF. A current to charge the capacitor 232 may be about 50 nA to generate a delay of 10-20 μs. The values may depend on the target delay value and the charging current.

Figure 3A:
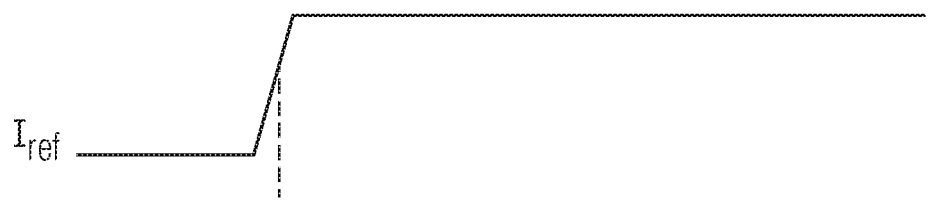
FIGS. 3A-3E illustrate timing diagrams and graphs of circuit characteristics in accordance with FIGS. 1 and 2.
Figure 3B:
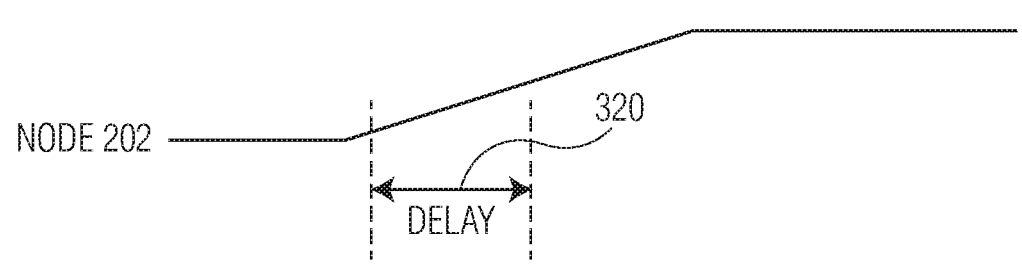
Figure 3C:
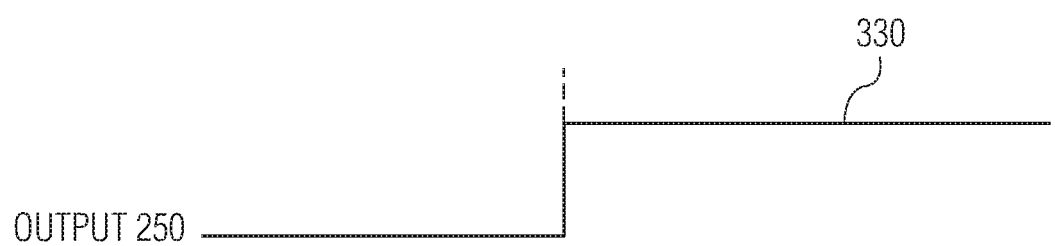
Figure 3D:
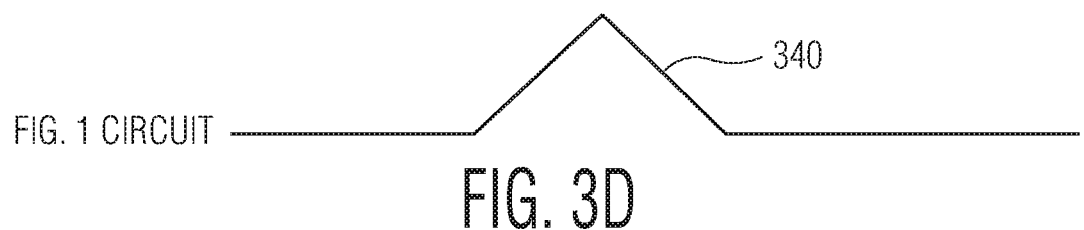

FIGS. 3A-3E illustrate timing diagrams and graphs of circuit characteristics in accordance with FIGS. 1 and 2. FIG. 3A represents an input current $I_{REF}$ through PMOS transistor 218. Because of current mirroring, this same current or scaled current is present through PMOS transistor 231 and PMOS transistors 230. As illustrated, this current quickly rises from a low state to a high state when a device is turned on.

FIG. 3B represents a slow voltage rise at node 202. Following a ramp-up of the control signal or supply VDD. Because of the delaying action of the plurality of current starved stages 205 in combination with the capacitor 232, current slowly rises at node 202 and passes to node 208 through the time delay circuit 255. Current to charge the capacitor 232 may be turned on or off by the PMOS transistor 218 that is enabled by the supply VDD or a control signal via the switch 203 to implement a time delay 320.

Figure 3E:
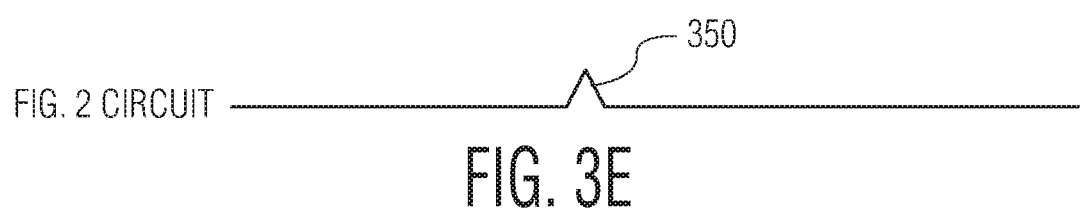

As illustrated in FIG. 3C, when an input current value rises at node 208 to a threshold level 330, the logic circuit 245 will toggle, producing an output signal 250. Due to the slow ramp-up of node 202, the time delay 320 occurs in the time delay circuit 255 from the initial entry of the supply VDD or control signal of switch 203 to the output 250. A design as in FIG. 1 will yield a wide current spike 340 illustrated in FIG. 3D, while the delay cell circuit 200 of FIG. 2 minimizes both the peak value the width of the current spike 350 as illustrated in FIG. 3E. The width of the current spike represents the duration of the short-through current. The height of the current spike is a value of the short-through current.

Example embodiments are not limited to generating delay on the rising edge of a signal or the supply VDD as in FIG. 2. Current starved stages 205 can be modified to generate a falling edge delay of a signal by sinking current from a capacitor connected to the supply. To accommodate the different design, the pull-up and pull-down switches may be be updated based on the proper initial status. Example embodiments described herein minimize the transition current of the delay cell circuit 200 and are able to output reliable status information in a glitch free manner.

Although the various example embodiments have been described in detail with particular reference to certain exemplary aspects thereof, it should be understood that the invention is capable of other example embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

The invention claimed is:

1. An integrated circuit delay cell, comprising:
an input circuit to establish a current level in the circuit;
a switch configured to control an on/off time of a delay circuit;
the delay circuit including at least one current starved stage configured to mirror the current level and a plurality of nodes,
the delay circuit configured to control a speed of a rise and/or fall time of an output signal; and
a glitch discharging circuit coupled to the delay circuit and configured to discharge the plurality of nodes within the delay circuit before the current level is established in the circuit, in response to a received power-on-reset signal.

2. The delay cell of claim 1, wherein the delay circuit includes a plurality of current starved stages.

3. The delay cell of claim 2, wherein each stage includes a current limiting transistor and an inverter.

4. The delay cell of claim 1, wherein each of the plurality of nodes is connected to a decoupling capacitor.

5. The delay cell of claim 4, wherein at least one of the decoupling capacitors is connected in parallel with a pull-down transistor.

6. The delay cell of claim 5, wherein the pull-down transistor is an NMOS transistor.

7. The delay cell of claim 4, wherein at least one of the decoupling capacitors is connected in parallel with a clamping transistor.

8. The delay cell of claim 4, wherein at least one of the decoupling capacitors is connected in parallel with a pull-up transistor.

9. The delay cell of claim 8,
wherein the pull-up transistor is a PMOS transistor.

10. A method of operating an integrated circuit delay cell, comprising:
establishing a circuit current using a first transistor of a first conductivity type;
establishing a mirrored current of the circuit current using at least one second transistor of the first conductivity type, wherein the plurality of second transistors are part of a delay circuit having at least one current stage and a plurality of nodes;
switching on/off time periods of the delay circuit;
discharging the plurality of nodes within the delay circuit, before the current level is established in the circuit, in response to a received power-on-reset signal; and
toggling an output logic device based on a rise and/or fall time of the delay circuit.

11. The method of claim 10, wherein a speed of the rise and/or fall time is determined by a number of current stages of the delay circuit.

12. The method of claim 10, comprising discharging charge from the nodes of the delay circuit using decoupling capacitors in parallel with transistors.

13. The method of claim 12, comprising pulling down at least one decoupling capacitor to ground using a pull-down transistor.

14. The method of claim 12, comprising pulling up at least one decoupling capacitor to a voltage source using a pull-up transistor.

15. The method of claim 12, comprising clamping a voltage level of the at least one decoupling capacitor using a clamping transistor.

16. The method of claim 10, comprising using at least one inverter in series with at least one second transistor to limit an amount of current in the delay circuit.

17. An integrated circuit delay cell, comprising:
an input circuit to establish a current level in the circuit;
a switch configured to control an on/off time of a delay circuit;

the delay circuit including at least one current starved stage configured to mirror the current level, the delay circuit configured to control a speed of a rise and/or fall time of an output signal;

a glitch discharging circuit connected to the delay circuit configured to tolerate and discharge unwanted charge of the delay circuit;

wherein the delay circuit includes a plurality of nodes to be discharged by the glitch discharging circuit;

wherein each of the plurality of nodes is connected to a decoupling capacitor; and wherein at least one of the decoupling capacitors is connected in parallel with a clamping transistor.

* * * * *